US009669723B2

(12) United States Patent
Sugeno et al.

(10) Patent No.: US 9,669,723 B2
(45) Date of Patent: Jun. 6, 2017

(54) POWER STORAGE DEVICE, POWER SYSTEM AND ELECTRIC VEHICLE

(71) Applicant: Sony Corporation, Tokyo (JP)

(72) Inventors: Naoyuki Sugeno, Fukushima (JP); Morihiko Sato, Kanagawa (JP); Koji Umetsu, Miyagi (JP)

(73) Assignee: SONY CORPORATION, Tokyo (JP)

( * ) Notice: Subject to any disclaimer, the term of this patent is extended or adjusted under 35 U.S.C. 154(b) by 327 days.

(21) Appl. No.: 14/375,309

(22) PCT Filed: Jan. 30, 2013

(86) PCT No.: PCT/JP2013/052638
§ 371 (c)(1),
(2) Date: Jul. 29, 2014

(87) PCT Pub. No.: WO2013/118738
PCT Pub. Date: Aug. 15, 2013

(65) Prior Publication Data
US 2015/0008931 A1 Jan. 8, 2015

(30) Foreign Application Priority Data

Feb. 6, 2012 (JP) .................... 2012-022715

(51) Int. Cl.
*H02J 7/00* (2006.01)
*H02J 7/04* (2006.01)
(Continued)

(52) U.S. Cl.
CPC ......... *B60L 11/1851* (2013.01); *B60L 3/0046* (2013.01); *B60L 3/0084* (2013.01);
(Continued)

(58) Field of Classification Search
CPC ...... H02J 7/0013; H02J 7/0021; H02J 7/0026; G01R 31/3606; G01R 31/3658

USPC .................. 320/134, 136; 324/434
See application file for complete search history.

(56) References Cited

U.S. PATENT DOCUMENTS 5,633,573 A * 5/1997 van Phuoc ......... G01R 31/3655
320/128
7,774,151 B2 * 8/2010 Bertness ............ G01R 31/3627
702/63
(Continued)

FOREIGN PATENT DOCUMENTS

EP 2 475 064 7/2012
JP 2009-089487 4/2009
(Continued)

OTHER PUBLICATIONS

International Search report issued in connection with International Application No. PCT/JP2013/052638, dated Jun. 14, 2013. (4 pages).

*Primary Examiner* — Richard Isla Rodas
*Assistant Examiner* — David V Henze-Gongola
(74) *Attorney, Agent, or Firm* — Chip Law Group

(57) ABSTRACT

An electronic storage module includes a plurality of batteries, a primary monitoring circuit configured to detect an operating state of the plurality of batteries, a microcontroller unit connected to the primary monitoring circuit via a primary communication path, and a secondary monitoring circuit connected to the microcontroller unit via a secondary communication path. The secondary monitoring circuit is configured to detect the operating state of the plurality of batteries when a determination is made of an abnormality in the primary communication path, or an abnormality in the operating state of the primary monitoring circuit.

24 Claims, 9 Drawing Sheets

(51) Int. Cl.
*G01N 27/416* (2006.01)
*B60L 11/18* (2006.01)
*B60L 3/00* (2006.01)
*G01R 31/36* (2006.01)
*G01R 35/00* (2006.01)
*G01R 19/165* (2006.01)

(52) U.S. Cl.
CPC .......... *B60L 11/18* (2013.01); *G01R 31/3606* (2013.01); *G01R 31/3658* (2013.01); *H02J 7/0014* (2013.01); *H02J 7/0021* (2013.01); *H02J 7/0026* (2013.01); *G01R 19/16542* (2013.01); *G01R 31/3624* (2013.01); *G01R 35/00* (2013.01); *Y02T 10/7011* (2013.01); *Y02T 10/7055* (2013.01); *Y02T 90/16* (2013.01)

(56) References Cited

U.S. PATENT DOCUMENTS

| | | | |
|---|---|---|---|
| 2007/0024240 A1* | 2/2007 | Morita | G01R 31/3675 320/128 |
| 2007/0145949 A1* | 6/2007 | Matsushima | H02J 7/00 320/132 |
| 2009/0085516 A1* | 4/2009 | Emori | B60L 3/0046 320/118 |
| 2009/0138767 A1* | 5/2009 | Mochizuki | G01R 31/31704 714/704 |
| 2010/0259221 A1* | 10/2010 | Tabatowski-Bush | H01M 10/4207 320/134 |
| 2010/0283473 A1 | 11/2010 | Vandensande | |
| 2011/0014501 A1* | 1/2011 | Scheucher | B60K 1/04 429/7 |
| 2011/0145629 A1 | 6/2011 | Li et al. | |
| 2011/0193413 A1 | 8/2011 | Kudo et al. | |
| 2012/0187908 A1* | 7/2012 | Tanigawa | B60L 11/1851 320/116 |

FOREIGN PATENT DOCUMENTS

JP   2011078163 A   *  4/2011
WO   2007/134320      11/2007

* cited by examiner

POWER STORAGE DEVICE, POWER SYSTEM AND ELECTRIC VEHICLE

CROSS REFERENCES TO RELATED APPLICATIONS

The present application is a national stage of International Application No. PCT/JP2013/052638 filed on Jan. 30, 2013 and claims priority to Japanese Patent Application No. 2012-022715 filed on Feb. 6, 2012, the disclosure of which is incorporated herein by reference.

BACKGROUND

The present disclosure relates to a power storage device, a power system and an electric vehicle using the power from the power storage device.

In recent years, use of a secondary battery such as a lithium ion battery has rapidly extended to a power storage device for electric power storage, storage battery for a vehicle and the like in which a new energy system such as solar batteries and wind power generation are combined. When using a plurality of electric storage elements for example, a unit battery (also, referred to as a single battery or a cell. Referred to as a battery cell in the description below as appropriate) for generating a large output, a configuration is employed in which a plurality of electric storage modules is connected in series. The electric storage modules configure a battery block by connecting a plurality of battery cells, for example, four, in parallel and/or in series. The electric storage module (also referred to as an assembled battery) is configured by enclosing a plurality of battery blocks in an outer case.

Further, a power storage device is known in which a plurality of electric storage modules is connected and a common control device (referred to as a main microcontroller unit as appropriate) is provided in a plurality of electric storage modules. The power storage device is configured such that each electric storage module has a module controller and communication is made between a module controller and the main microcontroller unit via a communication path.

Each electric storage module has the module controller consisting of a monitoring circuit and a microcomputer (referred to as a sub-microcontroller unit appropriately) to monitor the state of the battery cell and to detect abnormalities. The monitoring circuit monitors the voltage of each battery cell, compares a predetermined threshold value and a voltage of each battery cell using a comparator, and outputs a detection signal (for example, a 1-bit detection signal) indicating normality/abnormality thereof.

When charging the battery, the voltage of each battery cell is compared to a predetermined value and a detection signal, which illustrates whether or not the voltage is an overvoltage (referred to as OV appropriately), is generated. When discharging the battery, the voltage of each battery cell is compared to a predetermined value and the detection signal, which illustrates whether or not the voltage is an undervoltage (referred to as UV appropriately), is generated. When charging and discharging the battery, the current value flowing in the battery cell is compared to a predetermined value and the detection signal, which illustrates whether or not the current is an overcurrent (referred to as OC appropriately), is generated. Further, when charging and discharging the battery, the temperature of each battery cell is compared to a predetermined value respectively and the detection signal, which illustrates whether or not the temperature is in an overtemperature state (referred to as OT appropriately), is generated.

Further, the voltage and current of each battery cell are supplied to the sub-microcontroller unit of each module and a balance adjustment is made in which the voltages of the plurality of battery cells are equalized. The detection signal of the monitoring circuit described above is supplied to the sub-microcontroller unit via the communication path. Further, the detection signal is transmitted from the sub-microcontroller unit to the main microcontroller unit via the communication path. The main microcontroller unit receives the detection signal from each electric storage module and controls the charging and discharging operation.

For example, a DC power supply system for a vehicle consisting of a battery module having a group of a plurality of battery cells and a cell controller connected to the battery module is disclosed in PTL 1. The cell controller disclosed in PTL 1 has an integrated circuit having the same function as the monitoring circuit described above.

CITATION LIST

Patent Literature

PTL 1: Japanese Unexamined Patent Application Publication No. 2009-089487

SUMMARY

Technical Problem

In a battery system (a DC power supply system), a monitoring circuit (the integrated circuit of the cell controller in PTL 1) for each electric storage module is required to be operating normally in order to correctly detect the state of each battery cell. When the monitoring circuit is abnormal, a main microcontroller unit does not correctly ascertain the state of the battery cell and charging and discharging of the battery may not be correctly controlled. Further, when abnormality also occurs in the communication path between a monitoring circuit and a sub-microcontroller unit or in the communication path between the sub-microcontroller unit and a main microcontroller unit, a similar problem occurs.

There is a problem in PTL 1 described above that the group of the battery cells, which is controlled by the integrated circuit, cannot be used when the abnormality of the integrated circuit occurs.

Accordingly, an object of the present disclosure is to provide a power storage device, a power system and an electric vehicle which prevent the problem that the state of the battery cells is not capable of being monitored when the abnormality of the monitoring circuit or the abnormality of the communication path occurs.

Solution to Problem

In one embodiment, an electronic storage module includes a plurality of batteries, a primary monitoring circuit configured to detect an operating state of the plurality of batteries, a microcontroller unit connected to the primary monitoring circuit via a primary communication path, and a secondary monitoring circuit connected to the microcontroller unit via a secondary communication path. The secondary monitoring circuit is configured to detect the operating state of the plurality of batteries when a determination is made of an abnormality in the primary communication path, or an abnormality in the operating state of the primary monitoring circuit.

In another embodiment, a battery system includes an electronic control unit, a plurality of main microcontroller units connected to the electronic control unit, and a plurality of electronic storage modules connected to each of the main microcontroller units. Each of the electronic storage modules include a plurality of batteries, a primary monitoring circuit configured to detect an operating state of the plurality of batteries, a sub-microcontroller unit connected to the primary monitoring circuit via a primary communication path, and a secondary monitoring circuit connected to the module controller via a secondary communication path, the secondary monitoring circuit configured to detect the operating state of the plurality of batteries when a determination is made of an abnormality in the primary communication path, or an abnormality in the operating state of the primary monitoring circuit.

In another embodiment, an electric vehicle includes an electronic storage module including a plurality of batteries, a primary monitoring circuit configured to detect an operating state of the plurality of batteries, a microcontroller unit connected to the primary monitoring circuit via a primary communication path, and a secondary monitoring circuit connected to the module controller via a secondary communication path, the secondary monitoring circuit configured to detect the operating state of the plurality of batteries when a determination is made of an abnormality in the primary communication path, or an abnormality in the operating state of the primary monitoring circuit. The electric vehicle also includes a converter configured to receive and convert a supply of electric power from the electronic storage module, and to supply the converted power to a component of the electric vehicle.

Effects of Invention

According to the present invention, the charging and the discharging of the battery can be continued using the second monitoring section by substituting the function of the first monitoring section when there is a fault with the first monitoring section.

Additional features and advantages are described herein, and will be apparent from the following Detailed Description and the figures.

DETAILED DESCRIPTION

The embodiments described below are preferred specific examples of the present disclosure and various technically favorable limitations are added. However, in the description below, the range of the present disclosure is not limited to the embodiments unless specific mention is made as to a limitation.

Power Storage Device

A configuration is employed in which a plurality of electric storage units (hereinafter, referred to as electric storage modules) are connected and a control device is commonly provided in the plurality of electric storage modules when using a plurality of electric storage elements, for example, battery cells, in order to generate a large output. The configuration is referred to as a power storage device. Other than the battery, a capacitor or the like may be used as the electric storage element.

The electric storage module is a unit in which a battery section which includes connection in series of a plurality of battery cells for example, lithium ion secondary batteries or connection in series of connection (battery blocks) in parallel of a plurality of battery cells, and a module controller which is provided for each module are combined. A sub-microcontroller unit of each module controller is connected to a main microcontroller unit that is the entire control device and the main microcontroller unit performs charging management, discharging management, deterioration restraint management or the like.

The module controller and the main microcontroller unit are connected via a bus for each storage module. As the bus, a serial interface is used. As the serial interface, specifically, an SM bus (System Management Bus), CAN (Controller Area Network), SPI (Serial Peripheral Interface) or the like is used.

Each module controller of the sub-microcontroller unit and the main microcontroller unitperform communication. In other words, the information of the internal state of each electric storage module, that is, battery information such as the information of the voltage of each battery cell and the voltage of the entire module, the current information, or the temperature information, is transmitted from the sub-microcontroller unit to the main microcontroller unit, and the charging process and the discharging process of each electric storage module are managed.

Figure 1:
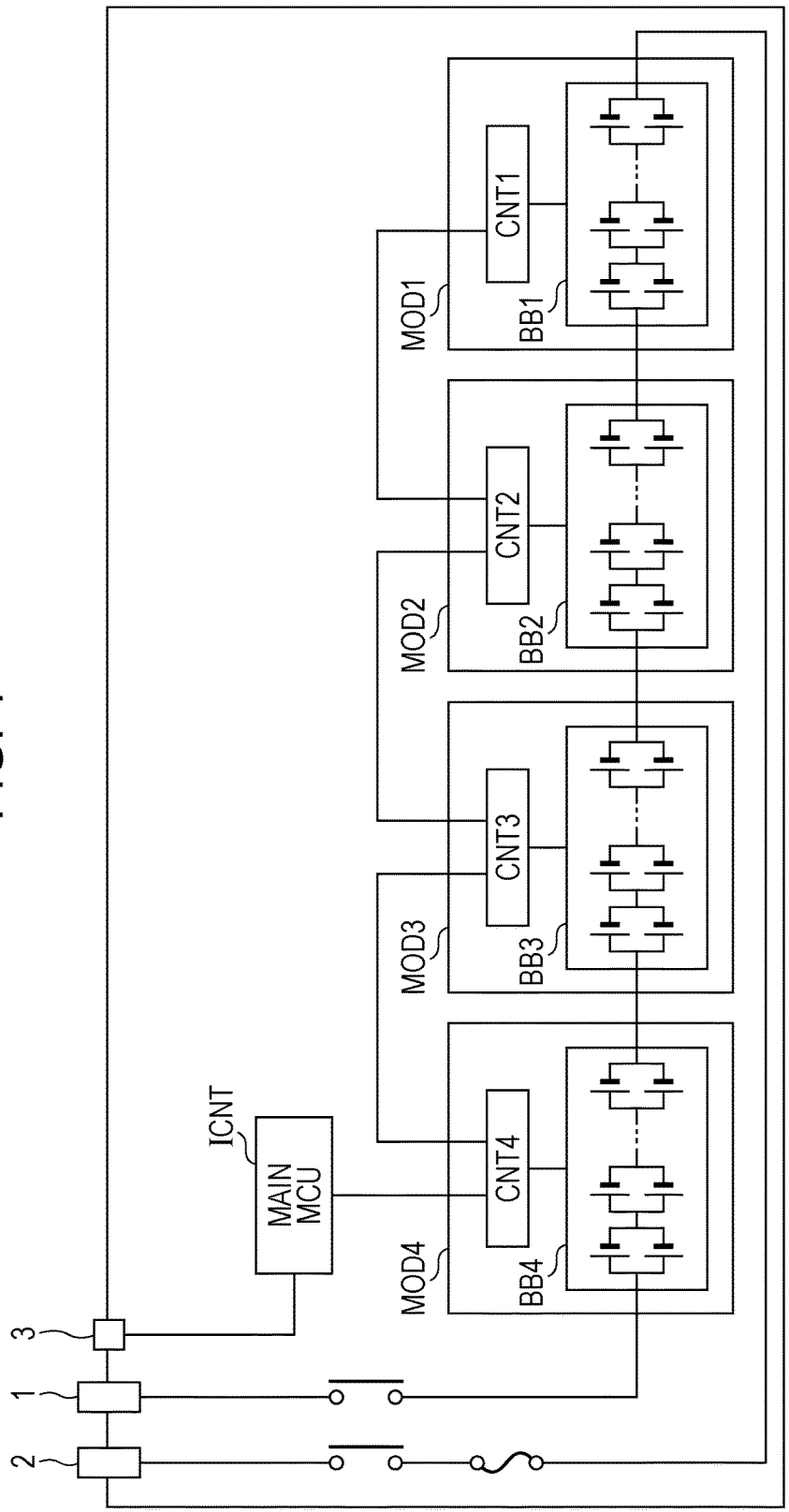
FIG. 1 is a block diagram of an example of a power storage device.

FIG. 1 illustrates an example of a specific connection configuration of the power storage device. For example, four electric storage modules MOD1 to MOD4 are connected in series. In this case, for example, the output voltage of the entire power storage device, for example, about 200 V, is taken out by a positive terminal 1 (VB+) and a negative terminal 2 (VB−). Each electric storage module respectively includes module controllers CNT1 to CNT4 and battery sections BB1 to BB4 in which the parallel connections of a plurality of battery cells or a plurality of battery blocks are connected in plurality. As described below, each module controller includes a monitoring circuit having an integrated circuit configuration and the sub-microcontroller unit.

The module controllers CNT1 to CNT4 are connected to each other via the bus and a communication terminal of the module controller CNT4 is connected to the main microcontroller unit ICNT. The battery information, such as the voltage for each module, is transmitted from each module controller to the main microcontroller unit ICNT. Further, the main microcontroller unit ICNT has a communication terminal 3 to communicate with the outside for example, an electronic control unit.

Figure 2:
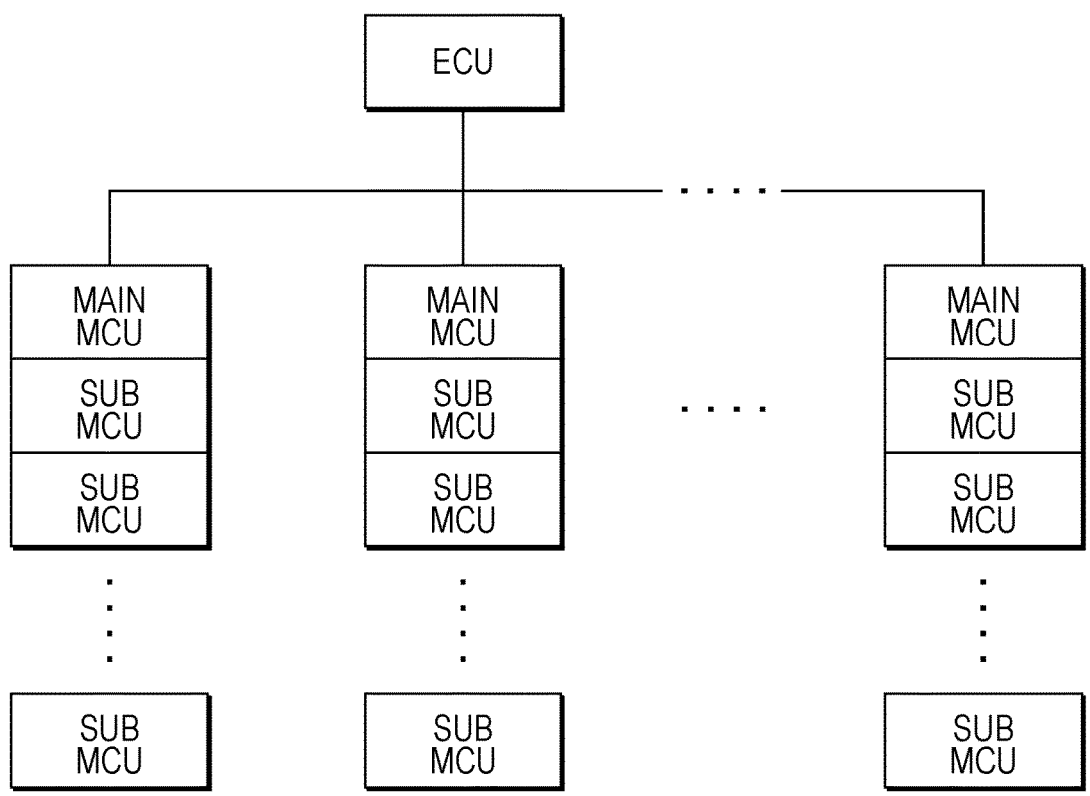
FIG. 2 is a block diagram illustrating a relationship of controller units in the power storage device.

In one embodiment of the present disclosure, as shown in FIG. 2, in order to control the plurality of electric storage modules, the sub-microcontroller unit (marked as a SUB MCU in the drawings) of each electric storage module is connected to the main microcontroller unit (marked as a MAIN MCU in the drawings). Further, a plurality of main microcontroller units is connected to the uppermost electronic control unit (marked as an ECU in the drawings). The electronic control unit is a generic term for a unit which generally controls analog equipment. As an example, the electronic control unit is a control unit which is mounted on a vehicle (an electric vehicle or a hybrid vehicle).

An Example of Module Controller

An example of a configuration of the module controller is described with reference to FIG. 3. In addition, for the sake of simplification, a balance adjustment circuit between cells for equalizing the voltage between cells and a balance adjustment circuit between modules for equalizing the voltage between modules are omitted.

The series connection for example, of n battery cells C1 to Cn of the battery section is connected to the monitoring circuit 10 having the integrated circuit configuration. The battery section may include one that is connected in series to the parallel connection of the plurality of battery cells. The monitoring circuit 10 and the sub-microcontroller unit 20 are connected to each other via a communication path 21. The monitoring circuit 10 and the sub-microcontroller unit 20 configures module controllers (CNT1 to CNT4 in FIG. 1) of each electric storage module. Further, the sub-microcontroller unit 20 and the main microcontroller unit ICNT are connected to each other via a communication path 22. The communication paths 21 and 22 may use a wired or a wireless communication path. Even not shown in FIG. 3, the sub-microcontroller unit of the module controller of another electric storage module is connected to the communication path 22.

The monitoring circuit 10 has a cell voltage multiplexer (MUX) 11. The voltage of n cells is multiplexed using time sharing by the cell voltage multiplexer 11, and is converted into a digital signal and further, is compared to the threshold value of the voltage in an A/D converter and a comparator (ADC & CMP) 12. The A/D converter and a comparator 12 outputs 14-18-bit digital voltage data of each battery cell and a comparison result (for example, a 1-bit signal) between the voltage of each battery cell and the threshold value of the voltage. The output signal of the A/D converter and the comparator 12 is supplied to a communication unit 13.

A resistance 23, which detects the current flowing in the battery section (the battery cells C1 to Cn), is connected in series to the battery section. The voltage of both ends of the resistance 23 is supplied to the A/D converter and the comparator (ADC & CMP) 14 via an amplifier 24. The digital current data and the comparison result (for example, the 1-bit signal) between the value of the current and threshold value of the current are output from the A/D converter and the comparator 14. The output signal of the A/D converter and the comparator 14 is supplied to the communication unit 13.

Further, a temperature measuring section 25, which detects the temperature of each battery cell, is provided. The temperature information from the temperature measuring section 25 is supplied to a temperature multiplexer (MUX) 15. The temperature data, which is multiplexed by the temperature multiplexer 15, is supplied to the A/D converter and the comparator 12. The A/D converter and the comparator 12 outputs the digital temperature data of each battery cell, and the comparison result (for example, the 1-bit signal) between the temperature of each battery cell and the threshold value of the temperature.

Figure 3:
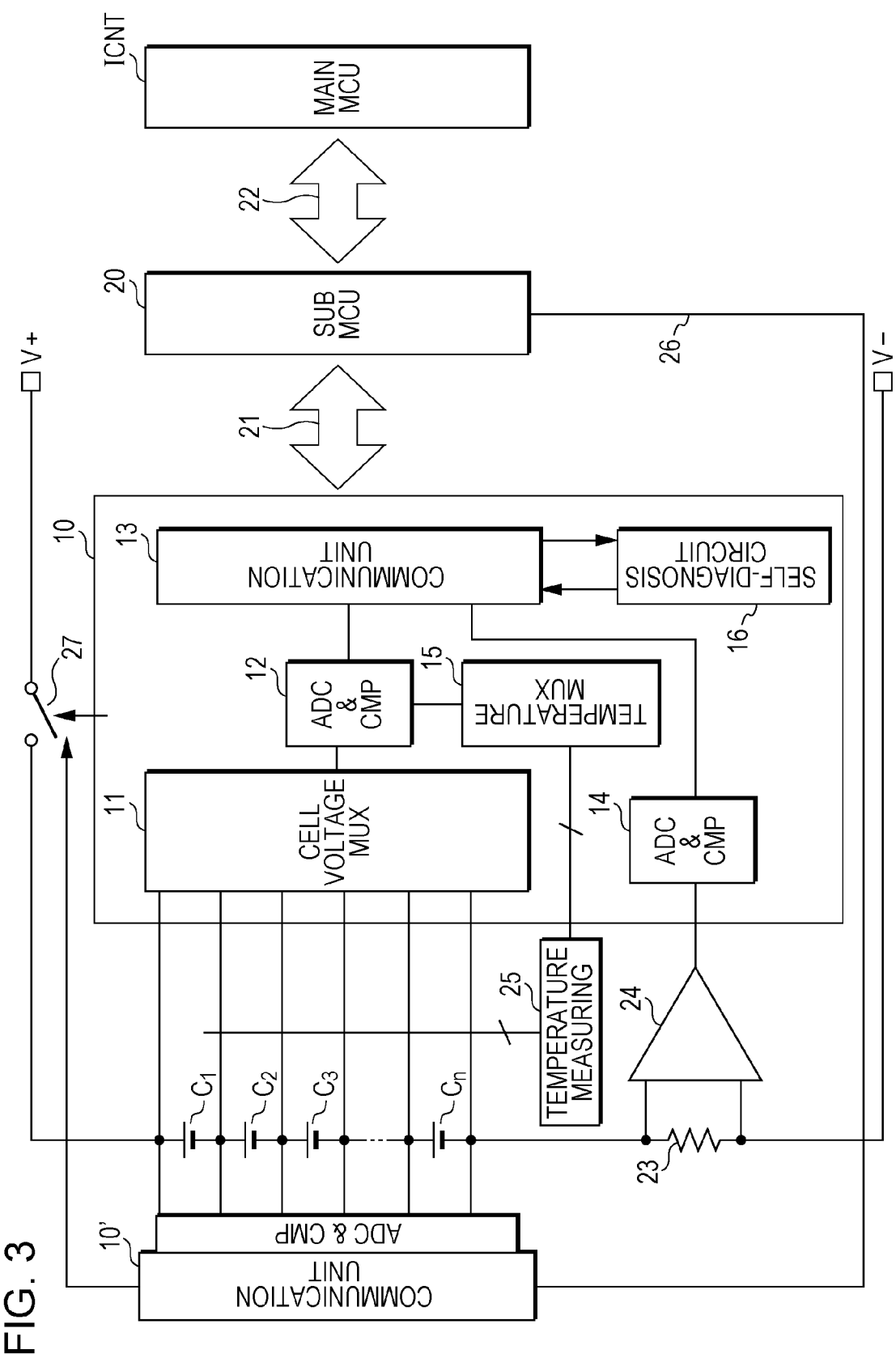
FIG. 3 is a block diagram of an example of a control section provided for each electric storage module in the present disclosure.

The configuration shown in FIG. 3 has one A/D converter and comparator 12 relating to the voltage and the temperature. However, the A/D converter and the comparator 12 relating to the voltage and the temperature may be provided separately. Further, the monitoring circuit 10 includes a self-diagnosis circuit 16. The self-diagnosis circuit 16 performs an integrated circuit test and tests whether or not a circuit block in the monitoring circuit 10 is operates normally. Specifically, test data value, which is known in beforehand, is supplied to the A/D converter and the comparator 12 and the A/D converter and the comparator 14, and the circuit test is performed according to whether or not a predetermined output is obtained from the circuits. In other words, the monitoring circuit 10 determines the normality/abnormality according to whether or not the voltage, the current and the temperature are within predetermined ranges.

The 1-bit signal, which is output from A/D converter and the comparator 12, is a detection signal indicating the normality/abnormality of the voltage of each battery cell. When charging the battery, the voltage of each battery cell is compared to the predetermined value and the detection signal illustrating whether or not the voltage is an overvoltage OV is generated. When discharging the battery, the voltage of each battery cell is compared to the predetermined value and the detection signal illustrating whether or not the voltage is an undervoltage UV is generated. Further, another signal of 1 bit, which is output from the A/D converter and the comparator 12, is a detection signal illustrating the overtemperature OT of the temperature of each battery cell. The signal of 1 bit, which is output from the A/D converter and the comparator 12, is the detection signal illustrating an overcurrent OC of the current. In addition, the temperature inside the monitoring circuit 10 is monitored and a detection signal indicating the abnormality of the temperature may be generated.

The communication unit 13 transmits the detection signal described above, the data of the voltage value, the data of the current value and the data of the temperature to the sub-microcontroller unit 20 via the communication path 21. As described below, the sub-microcontroller unit 20 performs a diagnostic process of the monitoring circuit 10 using the detection signal which is received. The detection signal, which is output from the monitoring circuit 10, and the data illustrating the result of the diagnostic process, are transmitted to the main microcontroller unit ICNT via the communication path 22. In addition, the data of the voltage value and the current value are also transmitted from the communication unit 13 to the sub-microcontroller unit 20. The sub-microcontroller unit 20 uses the values for the balance adjustment between the cells and the balance adjustment between the modules.

When there is a fault with the communication path 21 other than the abnormality of circuit block described above, the communication between the monitoring circuit 10 and the sub-microcontroller unit 20 may not be performed.

Further, when a failure occurs in the communication path 22 between the sub-microcontroller unit 20 and the main microcontroller unit ICNT, the communication between the sub-microcontroller unit 20 and the main microcontroller unit ICNT may not be performed. The fault of the communication paths 21 and 22 also produces a malfunction of the control process. As an example, the fault of the communication path 21 is detected using the sub-microcontroller unit 20. For example, communication is always performed between the communication unit 13 and the sub-microcontroller unit 20, and an abnormality in the communication path 21 is judged when data does not arrive from the communication unit 13 even though a predetermined time has elapsed. As another method, an abnormality in the communication path 21 is judged when the data is requested from the sub-microcontroller unit 20 to the communication unit 13 and there is no response from the communication unit 13.

The fault of the communication path 22 is detected using the main microcontroller unit ICNT. The main microcontroller unit ICNT generates the control signal for operating a shutdown switch according to the judgment output of the fault of the communication paths 21 and 22.

A secondary (substitute) monitoring circuit 10' having the same configuration as the monitoring circuit 10 described above is connected in parallel with the battery cells C1 to Cn to the monitoring circuit 10. When the monitoring circuit 10 has the integrated circuit configuration, the secondary monitoring circuit 10' is an external configuration. In other words, the secondary monitoring circuit 10' has the cell voltage multiplexer 11, the A/D converter and the comparator 12, and the communication unit 13. The self-diagnosis circuit 16 does may not necessarily be provided in the secondary monitoring circuit 10'.

A secondary (substitute) communication path 26 is provided between the secondary monitoring circuit 10' and the sub-microcontroller unit 20. Accordingly, when an abnormality of the circuit block of the monitoring circuit 10 or the fault of the communication path occurs, the function of the module controller may be maintained using the secondary monitoring circuit 10' and the sub-microcontroller unit 20. Accordingly, the function of the electric storage module to which the module controller is mounted is maintained.

Further, the shutdown switch 27, which is operated by the output of the monitoring circuit 10 or the secondary monitoring circuit 10', is inserted on the power supply line. Whether or not the shutdown switch 27 is operated is judged by the main microcontroller unit ICNT and the judgment result is transmitted to the monitoring circuits via the sub-microcontroller unit 20. When the shutdown switch 27 is turned off, the power supply line is opened and the power supply output is not generated. In this case, one configuration may be employed of a configuration in which the shutdown switch 27 is provided for each electric storage module and then the power supply is not output by the electric storage module unit, and a configuration in which the output of the entire electric storage module is not generated when the shutdown switch 27 of one electric storage module is turned off.

Flow of Control Process

The flow of the control process using the module controllers (the monitoring circuits 10 and 10', and the sub-microcontroller unit 20) described above is described with reference to FIGS. 4 and 5. The control of the main microcontroller unit ICNT and the electronic control unit is also related to the control of the module controller. In addition, the flowchart of a series of flows is divided and illustrated in FIGS. 4 and 5 due to limitation of the space of the drawings.

When charging and discharging (charging or discharging) of the battery are started in step S1, the monitoring circuit 10 starts its operation in step S2. Next, in step S3, the monitoring circuit 10 enters the self-diagnosis mode. In other words, the self-diagnosis circuit 16 performs a diagnosis whether or not the A/D converter and the comparator 12, the A/D converter and the comparator 14, the communication paths 21 and 22 are normal.

When the diagnosis result in step S3 is normal (marked as OK in the drawing, the same hereinafter), the process proceeds to step S4. In step S4, the monitoring circuit 10 starts the monitoring operation of the voltage of each battery cell, the current of the battery section and the temperature of each battery cell. When the diagnosis result in step S3 is abnormal (marked as NG in the drawing, the same hereinafter), the process returns to step S2 via step S5. In step S5, the sub-microcontroller unit 20 finally judges that the monitoring circuit 10 is abnormal.

When the result of the self-diagnosis just after starting is abnormal, the monitoring circuit 10 becomes the self-diagnosis mode again. After a predetermined number of times, if the self-diagnosis result is abnormal, an abnormality in the abnormality in monitoring circuit 10 is finally judged and the monitoring operation is switched by the secondary monitoring circuit 10' though omitted in FIG. 4. That the self-diagnosis is performed plural times allows the sub-microcontroller unit 20 to reliably judge an abnormality of the monitoring circuit 10. For example, as a result of retrying plural times, the abnormality of the abnormality in the monitoring circuit 10 is judged when the number of abnormal results is more than or equal to a predetermined time. Even though the circuit itself is normal, the judgment result of an abnormality may be generated caused by a bug in the communication program, timing control or the like so that the retry process is effective in increasing the reliability of the judgment.

The self-diagnosis is necessarily performed just after the start of charging and the discharging of the battery and thereafter self-diagnosis is performed only when a problem occurs in the monitoring circuit 10. When the result of the self-diagnosis in step S3 is normal, the monitoring operation starts using the monitoring circuit 10 in step S4. The charging and the discharging operation are continued.

Figure 4:
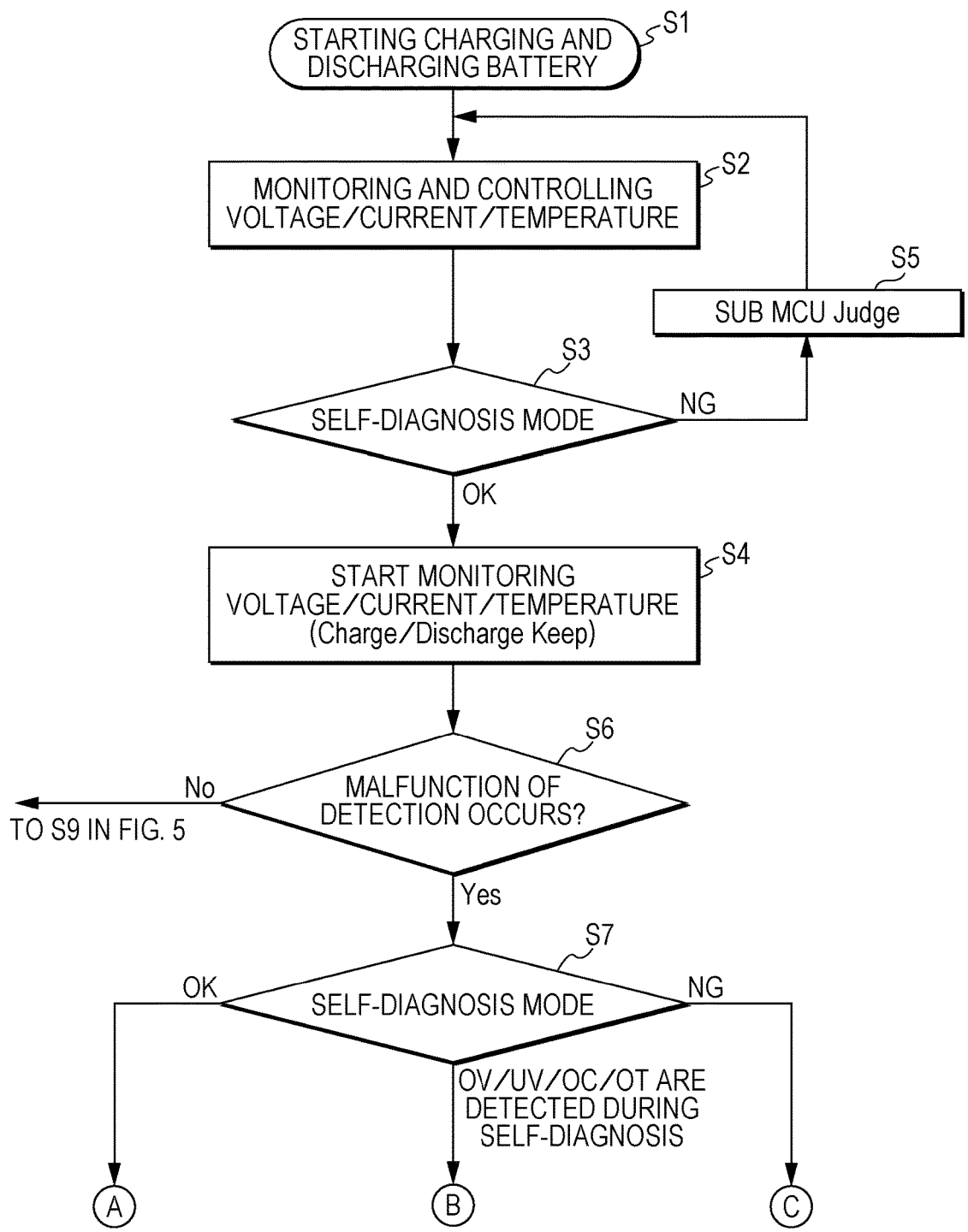
FIG. 4 is a flowchart which is used in the explanation of a self-diagnosis in the present disclosure.

In step S6, it is judged whether or not an abnormality of the circuit of the monitoring circuit 10 or n abnormality of the communication path occurs. When it is judged that abnormalities do not occur, the process proceeds to step S9 in FIG. 5 described below. When abnormalities occur, the monitoring circuit 10 becomes the self-diagnosis mode in step S7. The process after step S7 is described in FIG. 5. Symbols of A, B and C in FIG. 4 are connected to the symbols of A, B and C in FIG. 5.

The self-diagnosis in step S7 includes the retry process plural times as described above. As the judgment results in step S7, there are cases of normality (the reference symbol A), abnormality (the reference symbol C) and a case (the reference symbol B) where the detection signal illustrating OV (overvoltage), UV (undervoltage), OC (overcurrent) or OT (overtemperature) occurs during the self-diagnostic process.

Figure 5:
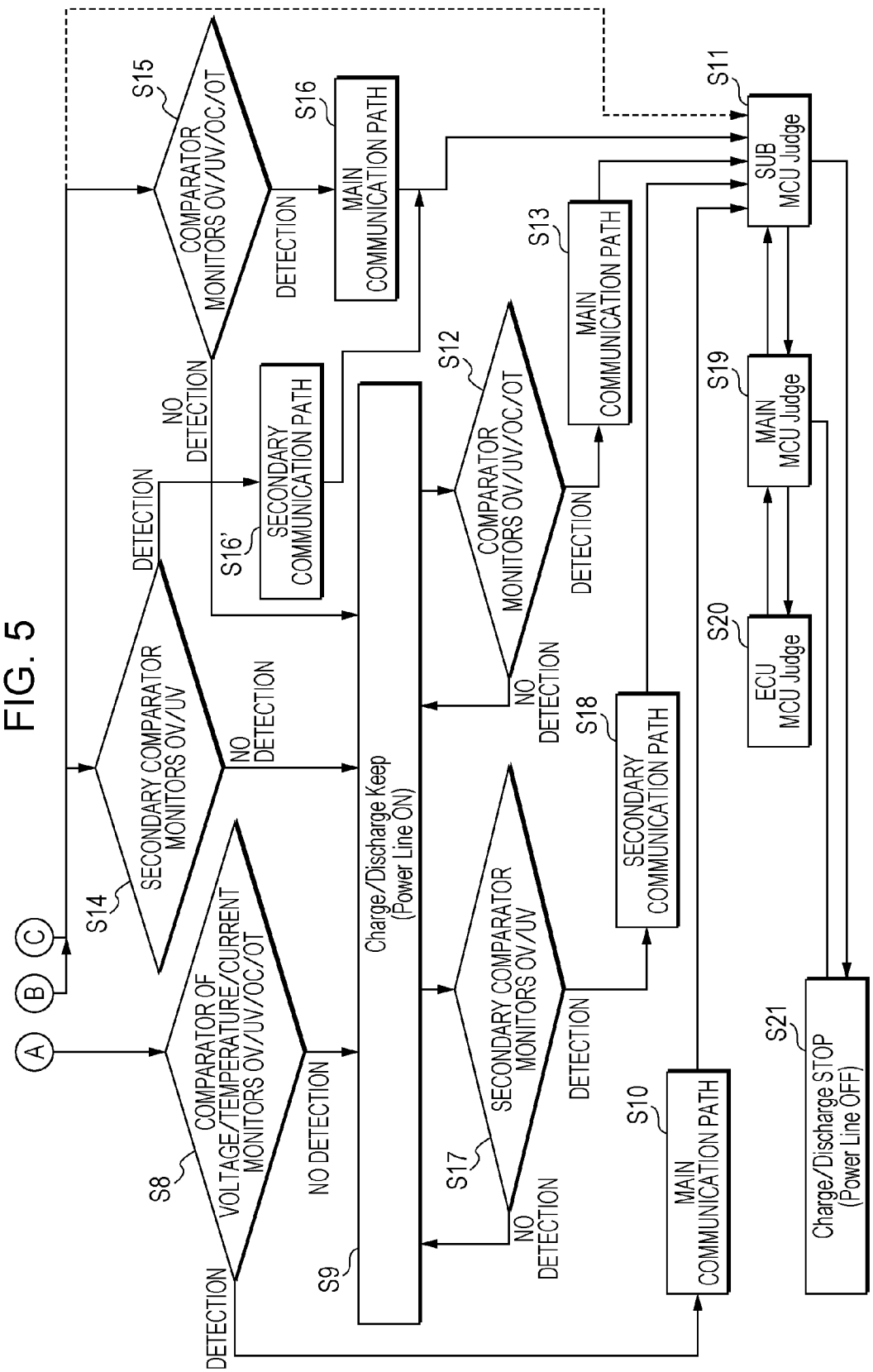
FIG. 5 is a flowchart which is used in the explanation of a self-diagnosis in the present disclosure.

When the result of the self-diagnosis is normal (the reference symbol A) in step S7, the monitoring circuit 10 performs the usual monitoring operation as shown in step S8 in FIG. 5. When none of OV/UV/OC/OT are detected, the process (charging/discharging keep and power line ON) in step S9 is performed.

In step S8 where the monitoring circuit 10 performs the monitoring operation, when one of OV/UV/OC/OT is detected, the detection signal is transmitted to the sub-microcontroller unit 20 via the (main) communication path 21 in step S10.

The sub-microcontroller unit 20, which receives the detection signal, performs the judgment process and judges the state thereof in step S11.

As illustrated in step S12, the monitoring operation is always performed using the A/D converter and the comparator of the monitoring circuit 10 even though the charging and the discharging of the battery are continued, and when OV/UV/OC/OT are not detected, the process returns to step S9. When OV/UV/OC/OT are detected, the detection signal is transmitted to the sub-microcontroller unit 20 via the main communication path 21 in step S13. The sub-microcontroller unit 20, which receives the detection signal, performs the judgement process and judges the state thereof in step S11.

When the self-diagnosis result in step S7 is abnormal (the reference symbol C), as illustrated in step S14 and step S15 in FIG. 5, the monitoring operation is performed. When no abnormality is detected in step S14 and step S15, the process (charging/discharging keep and power line ON) in step S9 is performed.

In step S14, when one of OV/UV is detected using the secondary monitoring circuit 10', the detection signal is transmitted to the sub-microcontroller unit 20 via the secondary communication path 26 in step S16'. When one of OV/UV/OC/OT is detected using the monitoring circuit 10 in step S15, the detection signal is transmitted to the sub-microcontroller unit 20 via the main communication path 21 in step S16. The sub-microcontroller unit 20, which receives the detection signal, performs the judgment process and judges the state thereof in step S11.

As illustrated in step S17, the monitoring operation is always performed using the A/D converter and the comparator of the secondary monitoring circuit 10' even though the charging and the discharging of the battery are continued, and when OV/UV are not detected, the process returns to step S9. When OV/UV are detected, the detection signal is transmitted to the sub-microcontroller unit 20 via the secondary communication path 26 in step S18. The sub-microcontroller unit 20, which receives the detection signal, performs the judgment process and judges the state thereof in step S11.

The sub-microcontroller unit 20 and the main microcontroller unit ICNT are connected to each other via the communication path 22, and the judgment process of the main microcontroller unit is performed in step S19. Further, the judgment process of the uppermost electronic control unit is performed in step S20.

When the self-diagnosis result of the monitoring circuit 10 or the secondary monitoring circuit 10' is normal and the detection signals illustrating OV/UV/OC/OT are received therefrom, stopping of the charging and the discharging of the battery and power line OFF are performed in step S21. The power line OFF is performed using the shutdown switch 27.

When the detection signals illustrating OV (overvoltage), UV (undervoltage), OC (overcurrent) or OT (overtemperature) are generated during the self-diagnosis (reference symbol B), the process proceeds to step S14 and step S15 (FIG. 5). In other words, the same process as when the self-diagnosis result in step S7 is abnormal (reference symbol C) is performed.

As described above, in an embodiment of the present disclosure, even though an abnormality occurs in the monitoring circuit 10 or the communication path, the monitoring is performed using the secondary monitoring circuit 10' and the monitoring may be switched in order to communicate via the secondary communication path 26 and then the charging and the discharging of the battery may be continued. Further, the self-diagnosis is retried a plurality of times when starting the operation and then the self-diagnosis may be reliably performed.

Other Example of Module Controller

Figure 6:
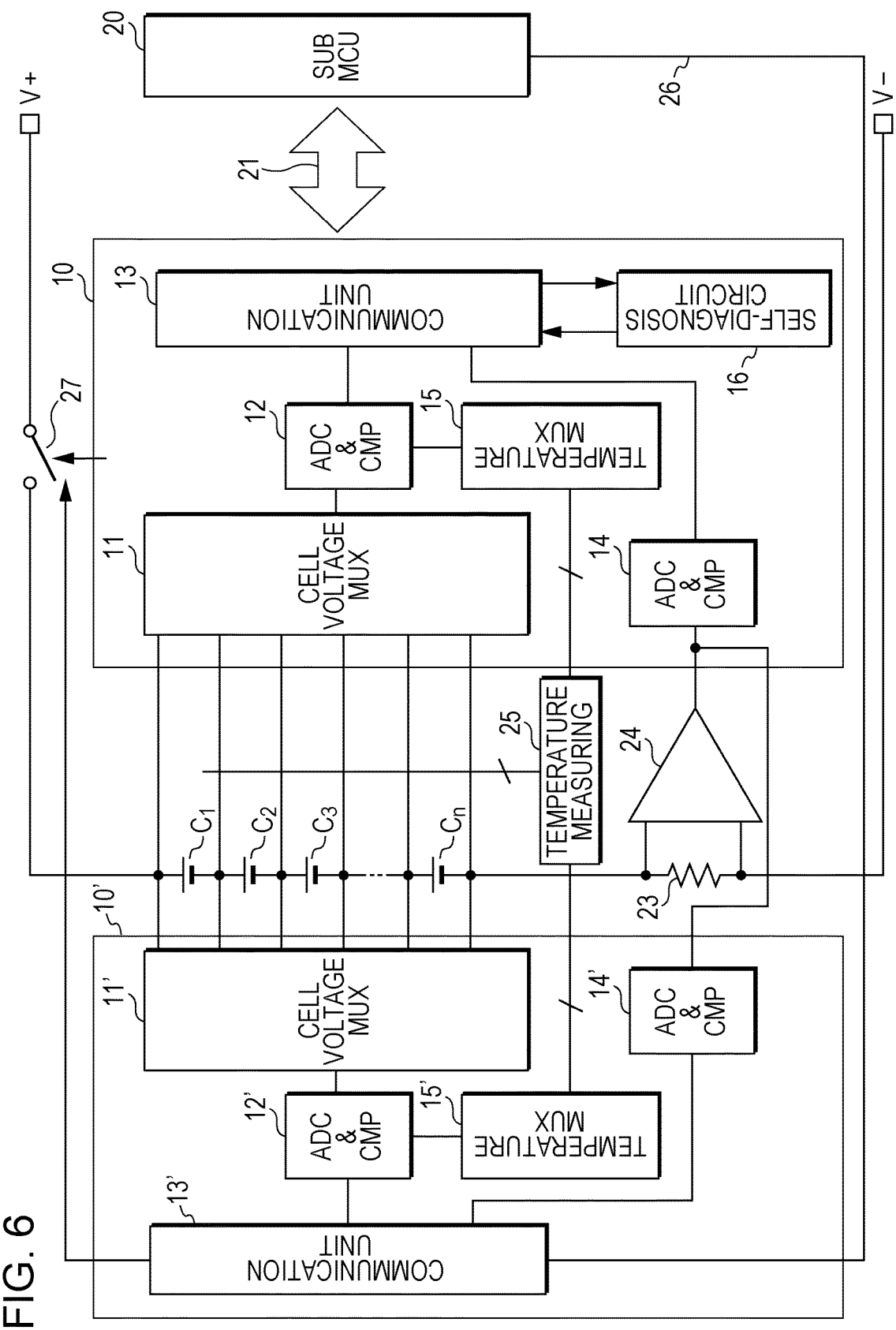
FIG. 6 is a block diagram of another example of a control section provided for each electric storage module in the present disclosure.

As shown in FIG. 3, an example of the module controller described above is configured such that the secondary (substitute) monitoring circuit 10' is connected in parallel with the monitoring circuit 10 to the battery cells C1 to Cn, and the voltage of the battery cells C1 to Cn is monitored. As shown in FIG. 6, similar to the monitoring circuit 10, the secondary monitoring circuit 10' may be provided having a cell voltage multiplexer (MUX) 11', an A/D converter and a comparator (ADC & CMP) 12', a communication unit 13', an A/D converter and the comparator (ADC & CMP) 14', a temperature multiplexer (MUX) 15'.

The secondary (substitute) communication path 26 is provided between the secondary monitoring circuit 10' and the sub-microcontroller unit 20. Accordingly, when an abnormality of the circuit block of the monitoring circuit 10 or the fault of the communication path occurs, the function of the module controller may be maintained using the secondary monitoring circuit 10' and the sub-microcontroller unit 20. Accordingly, the function of the electric storage module, where the module controller is mounted, is maintained.

Figure 7:
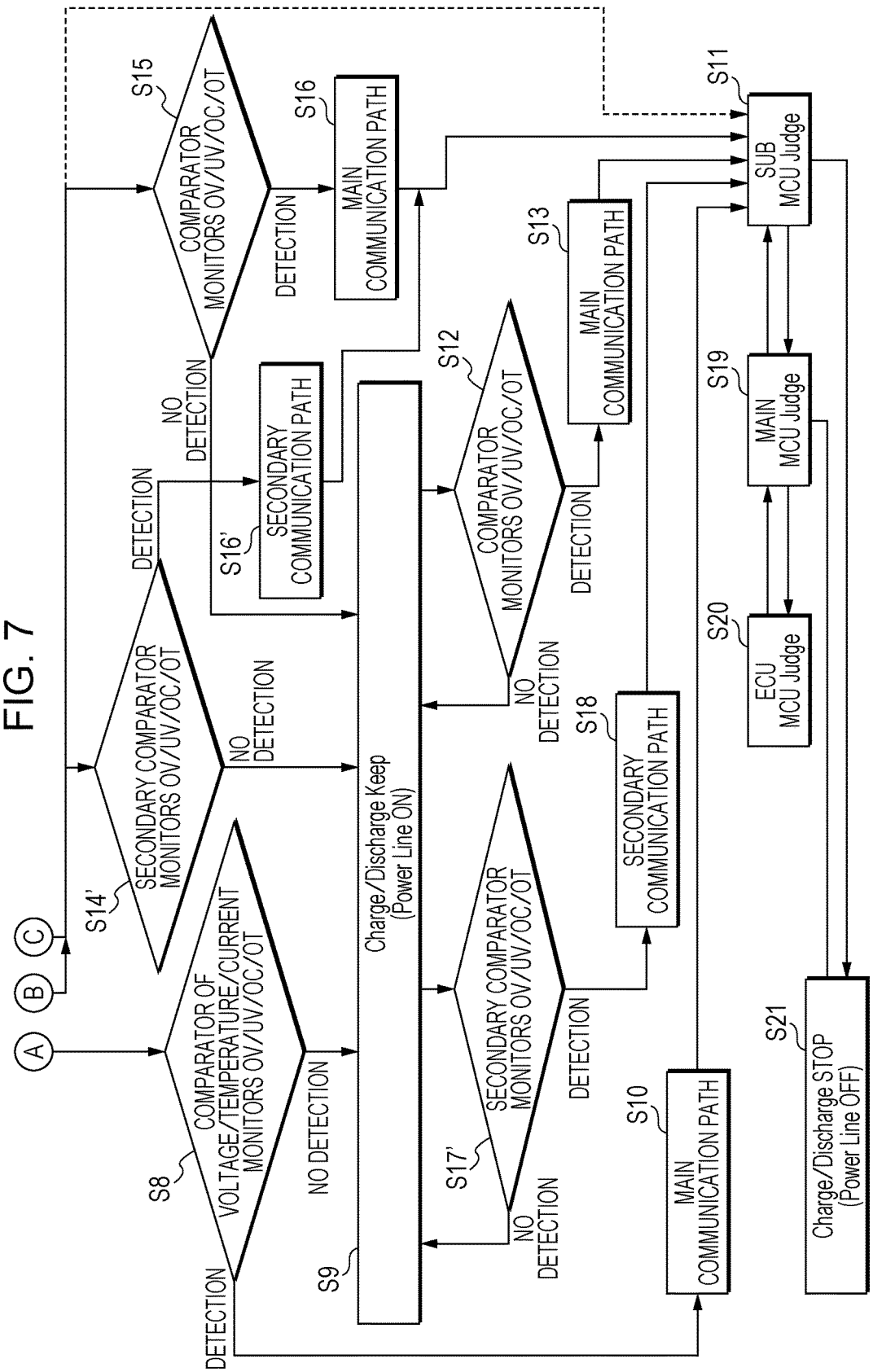
FIG. 7 is a flowchart using in the explanation of another example of the self-diagnosis in the present disclosure.

Even though the secondary monitoring circuit 10' is used, the same control as the above description is performed. FIG. 7 illustrates a second half (corresponding to FIG. 5) of the control process. Since the control corresponding to FIG. 4 is the same process, illustration thereof is omitted. Since the secondary monitoring circuit 10' monitors abnormality of the current and the temperature as well as the voltage, the secondary monitoring circuit 10' monitors abnormality (OC) of current and abnormality (OT) of the temperature in addition to abnormality (OV and UV) of the voltage as illustrated in step S14' and step S17' in FIG. 7. Since other processes are similar to FIG. 5, description thereof is omitted.

In addition, the present disclosure may have configurations described below.

(1)

An electronic storage module comprising: a plurality of batteries; a primary monitoring circuit configured to detect an operating state of the plurality of batteries; a microcontroller unit connected to the primary monitoring circuit via a primary communication path; and a secondary monitoring circuit connected to the microcontroller unit via a secondary communication path, the secondary monitoring circuit configured to detect the operating state of the plurality of batteries when a determination is made of an abnormality in the primary communication path, or an abnormality in the operating state of the primary monitoring circuit.

(2)

An electronic storage module according to (1), wherein the primary communication path is a wireless communication path.

(3)

An electronic storage module according to (1), wherein the primary monitoring circuit and/or the second monitoring circuit detects a normal or abnormal operating state of the plurality of batteries by determining whether or not voltage data, temperature data, and/or current data of the plurality of batteries are within predetermined ranges.

(4)

An electronic storage module according to (3), wherein the primary monitoring circuit includes: a communication unit; and a first A/D converter and comparator unit connected to the communication unit, the first A/D converter and comparator unit configured to receive the voltage data of the plurality of batteries from a cell voltage multiplexer, and output the voltage data and comparison results between the voltage of each battery and a voltage threshold value, and receive the temperature data of the plurality of batteries from a cell temperature multiplexer, and output the temperature data and comparison results between the temperature of each battery and a temperature threshold value.

(5)

An electronic storage module according to (4), wherein the primary monitoring circuit further includes: a resistor connected to the plurality of batteries; and a second A/D converter and comparator unit connected to the communication unit, the second A/D converter and comparator unit configured to receive the current data of the plurality of batteries that is output from the resistor, and output the current data and comparison results between the current of battery and a current threshold value.

(6)

An electronic storage module according to (3), wherein the primary monitoring circuit and/or the second monitoring circuit is configured to transmit a detection signal to the microcontroller unit via the primary communication path, the detection signal indicating a normal or abnormal operating state of the plurality of batteries based on one or more of the voltage data, the temperature data, and the current data.

(7)

An electronic storage module according to (3), further comprising: a power line; and a shutdown switch connected to the primary monitoring circuit and/or the secondary monitoring circuit, and inserted on the power line, wherein when the shutdown switch receives a signal indicating the abnormal operating state of the plurality of batteries, the shutdown switch turns off a power from the power line.

(8)

An electronic storage module according to (1), wherein the primary monitoring circuit includes a self-diagnosis circuit configured to perform an integrated circuit test to determine an operating state of a circuit block in the primary monitoring circuit.

(9)

An electronic storage module according to (8), wherein the self-diagnosis circuit is configured to initiate a monitoring and controlling operation of the electronic storage module by the secondary monitoring circuit if a predetermined number of integrated circuit test results have determined that the operating state of the circuit block is abnormal.

(10)

An electronic storage module according to (1), wherein the primary monitoring circuit includes a communication unit configured to communicate data regarding the operating state of the plurality of batteries with the microcontroller unit via the primary communication path, and wherein the microcontroller unit is configured to determine an abnormality in the primary communication path by a determination that data has not been communicated from the communication unit for a predetermined amount of time, or a determination that the microcontroller unit has not received a response from the communication unit after a request for said data has been made.

(11)

An electronic storage module according to (1), wherein an electronic configuration of the secondary monitoring circuit is the same as an electronic configuration of the primary monitoring circuit.

(12)

A battery system comprising: an electronic control unit; a plurality of main microcontroller units connected to the electronic control unit; a plurality of electronic storage modules connected to each of the main microcontroller units, each electronic storage module including a plurality of batteries, a primary monitoring circuit configured to detect an operating state of the plurality of batteries, a sub-microcontroller unit connected to the primary monitoring circuit via a primary communication path, and a secondary monitoring circuit connected to the module controller via a secondary communication path, the secondary monitoring circuit configured to detect the operating state of the plurality of batteries when a determination is made of an abnormality in the primary communication path, or an abnormality in the operating state of the primary monitoring circuit.

(13)

A battery system according to (12), wherein for each electronic storage module, the primary communication path is a wireless communication path.

(14)

A battery system according to (12), wherein for each electronic storage module, the primary monitoring circuit and/or the second monitoring circuit detects a normal or abnormal operating state of the plurality of batteries by determining whether or not voltage data, temperature data, and/or current data of the plurality of batteries are within predetermined ranges.

(15)

A battery system according to (14), wherein for each electronic storage module, the primary monitoring circuit includes: a communication unit; a first A/D converter and comparator unit connected to the communication unit, the first A/D converter and comparator unit configured to receive the voltage data of the plurality of batteries from a cell voltage multiplexer, and output the voltage data and comparison results between the voltage of each battery and a voltage threshold value, and receive the temperature data of the plurality of batteries from a cell temperature multiplexer, and output the temperature data and comparison results between the temperature of each battery and a temperature threshold value.

(16)

A battery system according to (15), wherein for each electronic storage module, the primary monitoring circuit further includes: a resistor connected to the plurality of batteries; and a second A/D converter and comparator unit connected to the communication unit, the second A/D converter and comparator unit configured to receive the current data of the plurality of batteries that is output from the resistor, and output the current data and comparison results between the current of each battery and a current threshold value.

(17)

A battery system according to (14), further comprising: a power line; and a shutdown switch connected to the primary monitoring circuit and/or the secondary monitoring circuit, and inserted on the power line, wherein when the shutdown switch receives a signal indicating the abnormal operating state of the plurality of batteries, the shutdown switch turns off a power from the power line.

(18)

A battery system according to (14), wherein for each electronic storage module, the primary monitoring circuit and/or the second monitoring circuit is configured to transmit a detection signal to the sub-microcontroller unit via the primary communication path, the detection signal indicating a normal or abnormal operating state of the plurality of batteries based on one or more of the voltage data, the temperature date, and the current data.

(19)

A battery system according to (18), wherein the main microcontroller unit is configured to receive detection signals transmitted from one or more of the sub-microcontroller units connected thereto.

(20)

A battery system according to (12), wherein for each main microcontroller unit, the main microcontroller unit is connected to the plurality of sub-microcontroller units by a common communication path, and the main microcontroller unit is configured to detect a fault of the common communication path.

(21)

A battery system according to (20), wherein each of the main microcontroller units are configured to generate a control signal for operating a shutdown switch of the respective electronic storage modules based on a detected fault of the respective common communication path.

(22)

A battery system according to (12), wherein for each electronic storage module, the primary monitoring circuit includes a self-diagnosis circuit configured to perform an integrated circuit test to determine an operating state of a circuit block in the primary monitoring circuit.

(23)

A battery system according to (22), wherein the self-diagnosis circuit is configured to initiate a monitoring and controlling operation of the electronic storage module by the secondary monitoring circuit if a predetermined number of integrated circuit test results have determined that the operating state of the circuit block is abnormal.

(24)

A battery system according to (12), wherein for each electronic storage module, the primary monitoring circuit includes a communication unit configured to communicate data regarding the operating state of the plurality of batteries with the sub-microcontroller unit via the respective primary communication path, and wherein each of the sub-microcontroller units are configured to determine an abnormality in the respective primary communication path by a determination that data has not been communicated from the communication unit for a predetermined amount of time, or a determination that the sub-microcontroller unit has not received a response from the communication unit after a request for said data has been made.

(25)

A battery system according to (12), wherein an electronic configuration of the secondary monitoring circuit is the same as an electronic configuration of the primary monitoring circuit.

(26)

An electric vehicle comprising: an electronic storage module including a plurality of batteries, a primary monitoring circuit configured to detect an operating state of the plurality of batteries, a microcontroller unit connected to the primary monitoring circuit via a primary communication path, and a secondary monitoring circuit connected to the module controller via a secondary communication path, the secondary monitoring circuit configured to detect the operating state of the plurality of batteries when a determination is made of an abnormality in the primary communication path, or an abnormality in the operating state of the primary monitoring circuit; and a converter configured to receive and convert a supply of electric power from the electronic storage module, and to supply the converted power to a component of the electric vehicle.

(27)

A method of monitoring an electronic storage module, the method comprising: (a) initiating charging or discharging of the electronic storage module; (b) initiating a monitoring and controlling operation of the electronic storage module by a primary monitoring circuit; (c) performing a self-diagnosis of at least one component and/or communication path of the primary monitoring circuit to determine a self-diagnosis result; (d) if the self-diagnosis result indicates an abnormal operating state of the primary monitoring circuit, repeating steps (b)-(d) until a normal self-diagnosis result is determined or a predetermined number of abnormal self-diagnosis results have been determined; and (e) if a predetermined number abnormal self-diagnosis results have been determined, initiating a monitoring and controlling operation of the electronic storage module by a secondary monitoring circuit.

(28)

A method according to (27), wherein if a normal self-diagnosis result of the primary monitoring circuit is determined in step (d), the method further comprises initiating, with the primary monitoring circuit, a monitoring operation of voltages, currents and temperatures of a plurality of battery cells of the electronic storage module.

(29)

A method according to (27), wherein if the primary monitoring circuit detects an abnormal operating state of the electronic storage module, a detection signal is transmitted to a microcontroller unit via a primary communication path, and wherein if the secondary monitoring circuit detects an abnormal operating state of the electronic storage module, a detection signal is transmitted to the microcontroller unit via a secondary communication path.

(30)

A method according to (29), wherein an abnormal operating state of the electronic storage module includes at least one of an overvoltage condition, an undervoltage condition, an overcurrent condition and an overtermperature condition of at least one of a plurality of battery cells of the storage module.

(31)

A power storage device including:
one or more electric storage elements,
a first monitoring section monitoring a state of the plurality of electric storage elements during charging or discharging of a battery,
a control section receiving a state signal from the first monitoring section, and
a second monitoring section substituting the first monitoring section when the first monitoring section is abnormal, as a self-diagnosis result of the first monitoring section.

(32)

The power storage device according to (31), wherein it is judged that the first monitoring section is abnormal when one of a voltage, a temperature and a current of the first monitoring section is not in a predetermined range.

(33)

The power storage device according to any of (31) and (32), wherein the first monitoring section and the control section are connected to each other via a first communication path, the second monitoring section and the control section are connected to each other via a second communication path, and the state signal is transmitted from the second monitoring section to the control circuit via the second communication path when the first communication path is abnormal.

(34)

The power storage device according to any one of (31), (32) and (33), wherein the abnormality in the first communication path is judged when the control section is not capable of receiving data from the first monitoring section in a predetermined time.

(35)

The power storage device according to any one of (31), (32), (33) and (34), wherein the control section requests the data from the first monitoring section and the abnormality in the first communication path is judged when there is no reply for the request.

(36)

The power storage device according to any one of (31), (32), (33), (34) and (35), wherein the charging or the discharging is stopped when the state signal is abnormal during the self-diagnostic process of the first monitoring section.

(37)

The power storage device according to any one of (31), (32), (33), (34), (35) and (36), wherein the self-diagnosis of the first monitoring section is performed when starting the charging or the discharging, and a retry is performed a plurality of times when the self-diagnosis result is abnormal.

(38)

The power storage device according to any one of (31), (32), (33), (34), (35), (36) and (37), wherein the self-diagnosis of the first monitoring section is performed during the charging or the discharging operation and the monitoring operation is switched to the second monitoring section when the self-diagnosis result is abnormal.

(39)

The power storage device according to any one of (31), (32), (33), (34), (35), (36), (37) and (38), wherein the first and the second monitoring sections compare at least one of the voltage, the current and the temperature of the plurality of electric storage elements to a threshold value thereof.

(40)

A power system including a power information receiving and transmitting section which receives and transmits a signal from other equipment via a network, wherein control of the charging and the discharging of the power storage device according to (31) is performed, based on the information that is received by the power information receiving and transmitting section.

(41)

An electric vehicle having a conversion device receiving a supply of power from the power storage device according to (31) and converting the power into a driving force of the vehicle, and a control device performing an information process relating to vehicle control, based on the information relating to the power storage device.

Power Storage Device in House as Application Example

Figure 8:
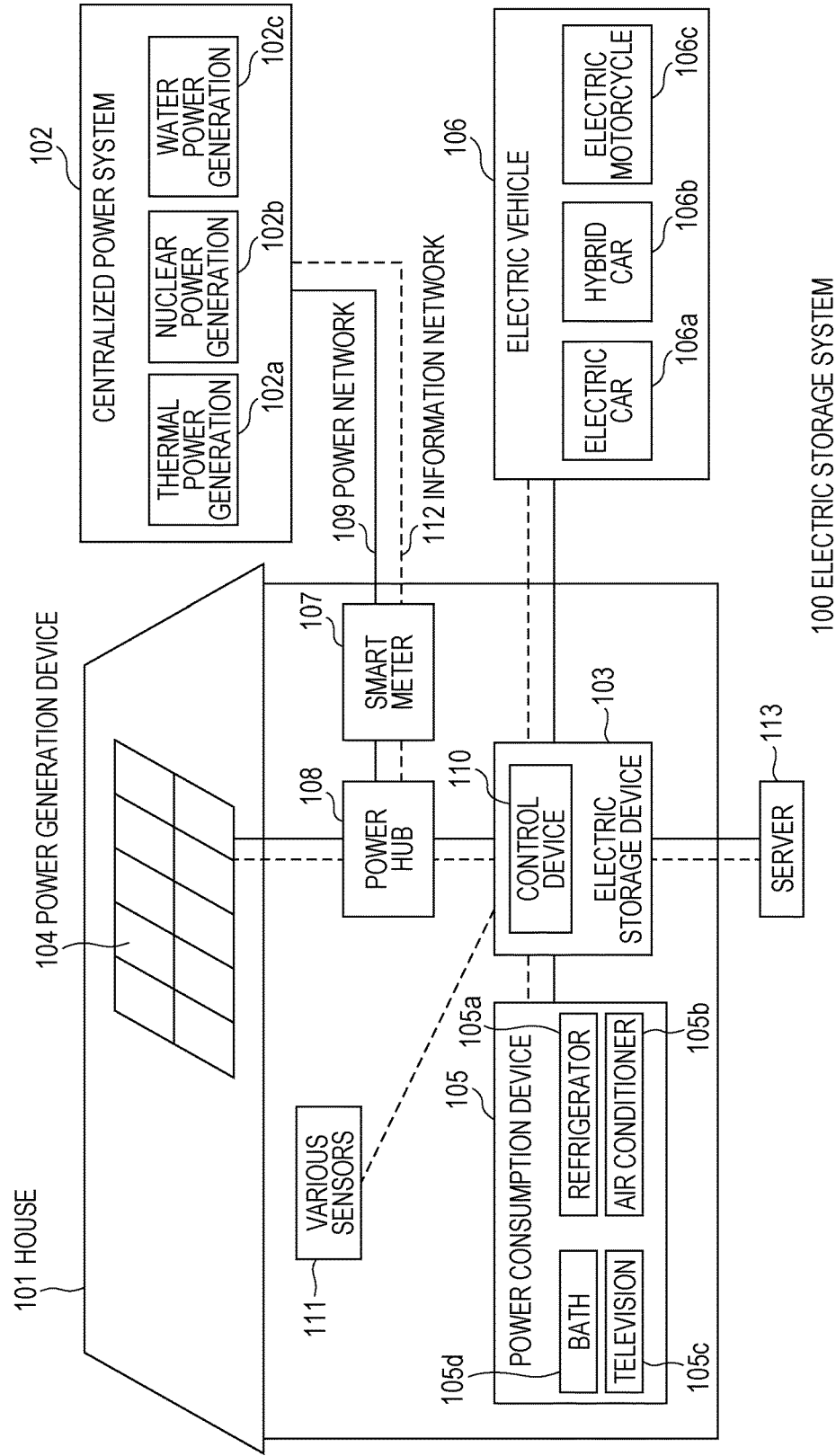
FIG. 8 is a block diagram of a first example of an application example of an electric storage system having a balance circuit between modules of the present disclosure.

An example of the present disclosure applied to a power storage device for a house is described with reference to FIG. 8. For example, in a power storage device (an electric storage system) 100 for a house 101, the power is supplied from an centralized power system 102 such as thermal power generation 102a, nuclear power generation 102b and water power generation 102c, to an electric storage device 103 via a power network 109, an information network 112, a smart meter 107, a power hub 108 or the like. Together with this, the power is supplied from an independent power supply such as a power generation device 104 in the home to the electric storage device 103. The power, which is supplied to the electric storage device 103, is stored. The power used in the house 101 is supplied using the electric storage device 103. Similar power storage devices are not only used in the house 101 but also in buildings.

The house 101 has the power generation device 104 (in the home), a power consumption device 105, the electric storage device 103, a control device 110 controlling each device, a smart meter 107 and sensors 111 acquiring a variety of information. Each device is connected using the power network 109 and the information network 112. As the power generation device 104 in the home, a solar battery, a fuel battery or the like is used, and the power, which is generated, is supplied to the power consumption device 105 and/or the electric storage device 103. The power consumption device 105 is a refrigerator 105a, an air conditioning device (an air conditioner) 105b, a television 105c, a bath 105d or the like. Further, the power consumption device 105 includes an electric vehicle 106. The electric vehicle 106 is an electric car 106a, a hybrid vehicle 106b and an electric bicycle 106c.

The battery unit of the present disclosure described above is applied to the electric storage device 103. The electric storage device 103 is configured of a secondary battery or a capacitor. For example, the electric storage device 103 is configured by a lithium ion battery. The lithium ion battery may be a fixed type or be used in the electric vehicle 106. The smart meter 107 has function to measure the consumption amount of commercial power and to transmit the measured consumption amount to a power company. The power network 109 may be composed of any one of or a plurality of a DC power supply, AC power supply and non-contact power supply.

The various sensors 111 are for example, a motion detector, an illumination sensor, an object detection sensor, a power consumption sensor, a vibration sensor, a contact sensor, a temperature sensor, an infrared sensor or the like. The information acquired using the various sensors 111 is transmitted to the control device 110. The state of the weather, the state of a person or the like is ascertained using the information from the sensors 111 and the power consumption device 105 is automatically controlled and thereby energy consumption may be minimized. Further, the control device 110 may transmit the information relating to the house 101 to the outside power company via the Internet.

Processes such as branching of power lines and conversion between direct current and alternating current are performed using the power hub 108. As a communication method of the information network 112 connected to the control device 110, there are a method of using a communication interface such as UART (Universal Asynchronous Receiver-Transceiver) and a method of using a sensor network according to the wireless communication standard such as Bluetooth (registered trademark), ZigBee and Wi-Fi. The Bluetooth (registered trademark) method is applied to multimedia communication and may perform communication of one-to-many connection. ZigBee uses the physical layer of IEEE (Institute of Electrical and Electronics Engineers) 802.15.4. IEEE 802.15.4 is the name of a short-range wireless network standard referred to as a PAN (Personal Area Network) or a W (Wireless) PAN.

The control device 110 is connected to an outside server 113. The server 113 may be managed by one of the house 101, the power company and a service provider. The information received and transmitted from the server 113 is information relating to for example, the power consumption information, life pattern information, power fee, weather information, natural disaster information and information relating to power business. The information may be received and transmitted from the power consumption device (for example, the television 105c) in the home or may be received and transmitted from a device (for example, a cellular phone or the like) outside the home. The information may be displayed on the equipment having a display function, for example, a television 105c, a cellular phone, a PDA (Personal Digital Assistant) or the like.

The control device 110 controlling each section is configured of a CPU (Central Processing Unit), a RAM (Random Access Memory), a ROM (Read Only Memory) or the like, and is enclosed in the electric storage device 103 in the example. The control device 110 is connected to the electric storage device 103, the power generation device 104 in the home, the power consumption device 105, the various sensors 111 and the server 113 via the information network 112, and has a function of, for example, adjusting the consumption amount of the commercial power and the amount of power generation. Furthermore, the control device 110 may include function to perform the power business in a power market.

As described above, not only the power from the centralized type power system 102 such as thermal power generation 102a, nuclear power generation 102b, water power generation 102c or the like, but also the power generated from the power generation device 104 (solar power generation and wind power generation) in the home may be stored in the electric storage device 103. Accordingly, even though the power generated from the power generation device 104 in the home varies, a control may be performed in which the amount of power, which is transmitted to the outside, is maintained constant or, the power is discharged as needed. Also, there are methods used for power, in which for example, power obtained from the solar power generation is stored in the electric storage device 103 and at the same time, mid-night power, which is cheap overnight, is stored in the electric storage device 103 at night-time, and then power which is stored using the electric storage device 103 is discharged and used in a time slot which is expensive in the daytime.

In addition, in the example, an example where the control device 110 is received in the electric storage device 103 is described, however, the control device 110 may be received in the smart meter 107 or may be configured independently. Further, the power storage device 100 may be used in a plurality of residences in an apartment building and may be used in a plurality of detached houses.

Power Storage Device in Vehicle as Application Example

Figure 9:
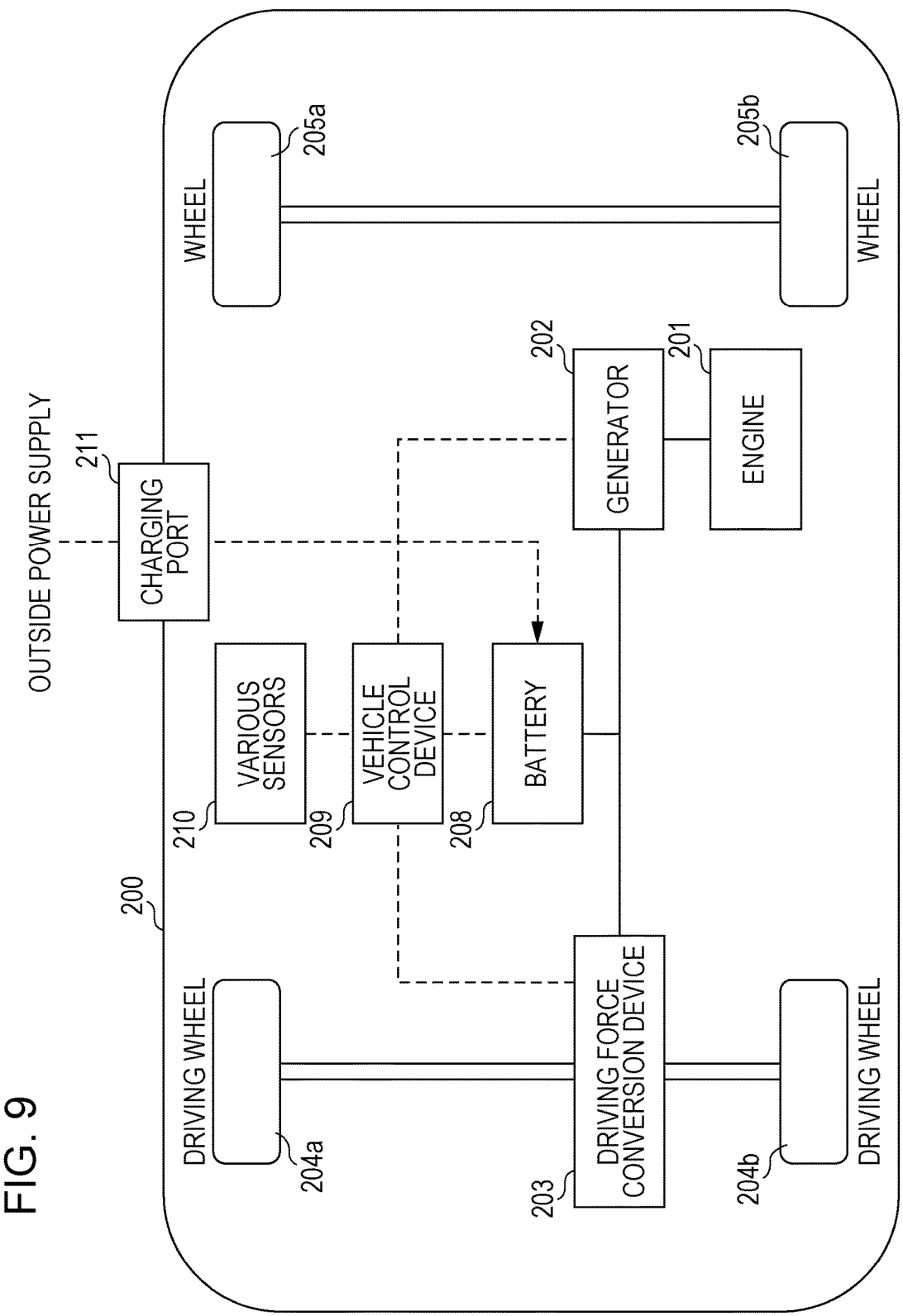
FIG. 9 is a block diagram of a second example of the application example of the electric storage system having the balance circuit between the modules of the present disclosure.

An example of the present disclosure applied to a power storage device for a vehicle is described with reference to FIG. 9. FIG. 9 schematically illustrates an example of a configuration of a hybrid vehicle employing a series hybrid system to which the present disclosure is applied. The vehicle having the series hybrid system runs with a power driving force conversion device using the power generated by the generator operating with an engine or the power stored once in the battery.

The hybrid vehicle 200 has an engine 201, a generator 202, a power driving force conversion device 203, a driving wheel 204a, a driving wheel 204b, a wheel 205a, a wheel 205b, a battery 208, a vehicle control device 209, various sensors 210 and a charging port 211. The battery unit of the present disclosure described above is applied to the battery 208.

The hybrid vehicle 200 runs using the power driving force conversion device 203 as a power source. An example of the power driving force conversion device 203 is a motor. The power driving force conversion device 203 operates using the power of the battery 208 and the rotational force of the power driving force conversion device 203 is transmitted to the driving wheels 204a and 204b. In addition, the power driving force conversion device 203 may be applied to an AC motor or a DC motor using DC-AC conversion or inversion (AC-DC conversion) as required. Various sensors 210 control the engine speed via the vehicle control device 209 or control the opening rate (opening rate of a throttle) of a throttle valve (not shown). The various sensors 210 include a speed sensor, an acceleration sensor, an engine speed sensor or the like.

The rotational force of the engine 201 is transmitted to the generator 202 and the power, which is generated by the rotational force thereof using the generator 202, is capable of being stored in the battery 208.

When the hybrid vehicle 200 is decelerated using a control mechanism (not shown), a resistance force during deceleration is added to the power driving force conversion device 203 as the rotational force and a regenerative power, which is generated by the rotational force using the power driving force conversion device 203, is stored in the battery 208.

The battery 208 is connected to an outside power supply of the hybrid vehicle 200 and then the power supply is received from the outside power supply via the charging port 211 as an input port, and the received power may be stored.

Though not shown in the drawing, an information processing device, which performs the information process relating to the vehicle control, based on the information relating to the secondary battery, may be provided. As the information process device, for example, there is an information process device, which performs display of a remaining capacity of the battery, based on the information relating to the remaining capacity of the battery.

As described above, as an example, the series hybrid vehicle is described which runs with the motor using the power generated with the generator which is started by the engine or the power stored momentarily in the battery. However, the present disclosure may be effectively applied to a parallel hybrid vehicle used appropriately by switching between three methods of running using only the engine, running using only the motor and running using the engine and the motor where the output from both the engine and the motor is the driving source. Further, the present disclosure may be effectively applied to a so-called electric vehicle which is run only by the driving motor without using the engine.

Modification Example

The embodiments of the present disclosure are described in detail, however, the present disclosure is not limited to each embodiment described above and various modifications may occur, based on the technical ideas of the present disclosure. For example, the configuration, the method, the process, the shape, the material, the numerical value or the like given in the embodiments described above are only examples, and other configurations, methods, processes, shapes, materials, numerical values or the like, which are different from the above description, may be used as needed.

In addition, the configuration, the method, the process, the shape, the material, the numerical value or the like of the embodiments described above may be combined with each other without departing from the gist of the present disclosure.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

MOD, MOD1 to MODN . . . electric storage module
ICNT . . . main microcontroller unit
CNT . . . controller of each electric storage module
BB1 to BBn . . . battery section
10 . . . monitoring circuit
10' . . . secondary monitoring circuit
12, 14 . . . A/D converter and comparator
13 . . . communication unit
16 . . . self-diagnosis circuit
20 . . . sub-microcontroller unit
21, 22 . . . communication path
26 . . . secondary communication path
27 . . . shutdown switch

The invention claimed is:

1. An electronic storage module, comprising:
a plurality of batteries;
a primary monitoring circuit configured to detect an operating state of the plurality of batteries,
wherein the primary monitoring circuit comprises:
a communication unit; and
a first A/D converter-and-comparator unit connected to the communication unit,
wherein the first A/D converter-and-comparator unit is configured to:
receive voltage data of the plurality of batteries from a voltage multiplexer, and output the voltage data and comparison results between the voltage data of each battery of the plurality of batteries and a voltage threshold value, and
receive temperature data of the plurality of batteries from a temperature multiplexer, and output the temperature data and comparison results between the temperature data of each battery of the plurality of batteries and a temperature threshold value;
a microcontroller unit connected to the primary monitoring circuit via a primary communication path; and
a secondary monitoring circuit connected to the microcontroller unit via a secondary communication path, wherein the secondary monitoring circuit is configured to detect the operating state of the plurality of batteries based on a determination of an abnormality in the primary communication path, or an abnormality in the operating state of the primary monitoring circuit.

2. The electronic storage module according to claim 1, wherein the primary communication path is a wireless communication path.

3. The electronic storage module according to claim 1, wherein at least one of the primary monitoring circuit or the secondary monitoring circuit is further configured to detect a normal operating state or an abnormal operating state of the plurality of batteries based on whether at least one of the voltage data, the temperature data, or current data of the plurality of batteries is within ranges.

4. The electronic storage module according to claim 1, wherein the primary monitoring circuit further comprises:
a resistor connected to the plurality of batteries; and
a second A/D converter-and-comparator unit connected to the communication unit, the second A/D converter-and-comparator unit configured to
receive current data of the plurality of batteries that is output from the resistor, and output the current data and comparison results between the current data of each battery of the plurality of batteries and a current threshold value.

5. The electronic storage module according to claim 3, wherein at least one of the primary monitoring circuit or the secondary monitoring circuit is further configured to transmit a detection signal to the microcontroller unit via one of the primary communication path or the secondary communication path, wherein the detection signal indicating the normal operating state or the abnormal operating state of the plurality of batteries based on one or more of the voltage data, the temperature data, or the current data.

6. The electronic storage module according to claim 3, further comprising:
a power line; and
a shutdown switch connected to at least one of the primary monitoring circuit or the secondary monitoring circuit, and inserted on the power line,
wherein based on a reception, by the shutdown switch, of a signal indicating the abnormal operating state of the plurality of batteries, the shutdown switch turns off power from the power line.

7. The electronic storage module according to claim 1, wherein the primary monitoring circuit comprises a self-diagnosis circuit configured to determine an operating state of a circuit block in the primary monitoring circuit by an integrated circuit test.

8. The electronic storage module according to claim 7, wherein the self-diagnosis circuit is further configured to initiate a monitoring and controlling operation of the electronic storage module by the secondary monitoring circuit based on a determination of an abnormal operating state of the circuit block using a number of integrated circuit test results.

9. The electronic storage module according to claim 1,
wherein the communication unit is configured to communicate data regarding the operating state of the plurality of batteries with the microcontroller unit via the primary communication path, and
wherein the microcontroller unit is configured to determine the abnormality in the primary communication path based on a determination of:
a communication of said data from the communication unit, or
a response communicated from the communication unit after a request for said data has been made.

10. The electronic storage module according to claim 1, wherein an electronic configuration of the secondary monitoring circuit is same as an electronic configuration of the primary monitoring circuit.

11. A battery system, comprising:
an electronic control unit;
a plurality of main microcontroller units connected to the electronic control unit; and a plurality of electronic storage modules connected to each of the plurality of main microcontroller units, each electronic storage module comprising:
  a plurality of batteries,
  a primary monitoring circuit configured to detect an operating state of the plurality of batteries,
    wherein the primary monitoring circuit comprises:
      a communication unit;
      a first A/D converter-and-comparator unit connected to the communication unit,
        wherein the first A/D converter-and-comparator unit is configured to:
          receive voltage data of the plurality of batteries from a voltage multiplexer, and output the voltage data and comparison results between the voltage data of each of the plurality of batteries and a voltage threshold value, and
          receive temperature data of the plurality of batteries from a temperature multiplexer, and output the temperature data and comparison results between the temperature data of each of the plurality of batteries and a temperature threshold value,
  a sub-microcontroller unit connected to the primary monitoring circuit via a primary communication path, and
  a secondary monitoring circuit connected to the sub-microcontroller unit via a secondary communication path, the secondary monitoring circuit configured to detect the operating state of the plurality of batteries based on a determination is of an abnormality in the primary communication path, or an abnormality in the operating state of the primary monitoring circuit.

12. The battery system according to claim 11, wherein for each electronic storage module of the plurality of electronic storage modules, the primary communication path is a wireless communication path.

13. The battery system according to claim 11, wherein for each electronic storage module of the plurality of electronic storage modules, at least one of the primary monitoring circuit or the secondary monitoring circuit detects one of a normal operating state or an abnormal operating state of the plurality of batteries based on whether at least one of the voltage data, the temperature data, or current data of the plurality of batteries is within ranges.

14. The battery system according to claim 11, wherein for each electronic storage module of the plurality of electronic storage modules, the primary monitoring circuit further includes comprises:
  a resistor connected to the plurality of batteries; and
  a second A/D converter-and-comparator unit connected to the communication unit, the second A/D converter-and-comparator unit configured to
    receive current data of the plurality of batteries that is output from the resistor, and output the current data and comparison results between the current data of each battery of the plurality of batteries and a current threshold value.

15. The battery system according to claim 13, further comprising:
  a power line connected to each of the plurality of electronic storage modules; and
  a shutdown switch connected to the at least one of primary monitoring circuit or the secondary monitoring circuit, and inserted on the power line,
    wherein based on a reception, by the shutdown switch, of a signal that indicates the abnormal operating state of the plurality of batteries, the shutdown switch turns off power from the power line.

16. The battery system according to claim 13, wherein for each electronic storage module of the plurality of electronic storage modules, at least one of the primary monitoring circuit or the secondary monitoring circuit is further configured to transmit a detection signal to the sub-microcontroller unit via one of the primary communication path or the secondary communication path, wherein the detection signal indicates the normal operating state or the abnormal operating state of the plurality of batteries based on one or more of the voltage data, the temperature data, or the current data.

17. The battery system according to claim 16,
  wherein the main microcontroller unit is configured to receive detection signals transmitted from one or more of the plurality of electronic storage modules connected thereto.

18. The battery system according to claim 11, wherein a main microcontroller unit of the plurality of main microcontroller units is connected to a plurality of the sub-microcontroller units by a common communication path, and the main microcontroller unit is configured to detect a fault of the common communication path.

19. The battery system according to claim 18, wherein each of the main microcontroller units of the plurality of main microcontroller units is configured to generate a control signal for operating a shutdown switch of the respective electronic storage modules based on a detected fault of the respective common communication path.

20. The battery system according to claim 11, wherein for each electronic storage module of the plurality of electronic storage modules, the primary monitoring circuit comprises a self-diagnosis circuit configured to determine an operating state of a circuit block in the primary monitoring circuit by an integrated circuit test.

21. The battery system according to claim 20, wherein the self-diagnosis circuit is further configured to initiate a monitoring and controlling operation of an electronic storage module of the plurality of electronic storage modules by the secondary monitoring circuit based on a determination of an abnormal operating state of the circuit block using a number of integrated circuit test results.

22. The battery system according to claim 11,
  wherein for each electronic storage module of the plurality of electronic storage modules, the communication unit is configured to communicate data regarding the operating state of the plurality of batteries with the sub-microcontroller unit via the respective primary communication path, and
  wherein the sub-microcontroller unit is configured to determine the abnormality in the primary communication path based on a determination of:
    a communication of data from the communication unit, or
    a response communicated from the communication unit after a request for said data has been made.

23. The battery system according to claim 11, wherein an electronic configuration of the secondary monitoring circuit is same as an electronic configuration of the primary monitoring circuit.

24. An electric vehicle, comprising:
  an electronic storage module including comprising:
    a plurality of batteries,
    a primary monitoring circuit configured to detect an operating state of the plurality of batteries,
      wherein the primary monitoring circuit comprises:
        a communication unit; and
        a first A/D converter-and-comparator unit connected to the communication unit,
          wherein the first A/D converter-and-comparator unit is configured to:
            receive voltage data of the plurality of batteries from a voltage multiplexer, and output the voltage data and comparison results between the voltage data of each battery of the plurality of batteries and a voltage threshold value, and receive temperature data of the plurality of batteries from a temperature multiplexer, and output the temperature data and comparison results between the temperature data of each battery of the plurality of batteries and a temperature threshold value;

a microcontroller unit connected to the primary monitoring circuit via a primary communication path, and a secondary monitoring circuit connected to the microcontroller unit via a secondary communication path, the secondary monitoring circuit configured to detect the operating state of the plurality of batteries based on a determination of an abnormality in the primary communication path, or an abnormality in the operating state of the primary monitoring circuit; and a converter configured to receive and convert a supply of electric power from the electronic storage module, and to supply the converted electric power to a component of the electric vehicle.

\* \* \* \* \*